(12) United States Patent
Wu et al.

(10) Patent No.: US 11,533,058 B2
(45) Date of Patent: Dec. 20, 2022

(54) DIGITAL PHASE-FREQUENCY DETECTOR WITH SPLIT CONTROL LOOPS FOR LOW JITTER AND FAST LOCKING

(71) Applicant: QUALCOMM Incorporated, San Diego, CA (US)

(72) Inventors: Zhengzheng Wu, Santa Cruz, CA (US); Chao Song, San Diego, CA (US); Karthik Nagarajan, Poway, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/125,595

(22) Filed: Dec. 17, 2020

(65) Prior Publication Data

US 2022/0200608 A1    Jun. 23, 2022

(51) Int. Cl.
| | |
|---|---|
| *H03L 7/085* | (2006.01) |
| *H03L 7/197* | (2006.01) |
| *H03L 7/099* | (2006.01) |
| *H03K 3/037* | (2006.01) |
| *H03K 5/00* | (2006.01) |
| *H03K 19/20* | (2006.01) |

(Continued)

(52) U.S. Cl.
CPC ........... *H03L 7/0995* (2013.01); *H03K 3/037* (2013.01); *H03K 5/00006* (2013.01); *H03K 19/20* (2013.01); *H03L 7/085* (2013.01); *H03L 7/093* (2013.01); *H03L 7/197* (2013.01); *H04M 1/725* (2013.01)

(58) Field of Classification Search
CPC ......... H03L 7/085; H03L 7/087; H03L 7/089; H03L 7/0891; H03L 7/0893; H03L 7/091; H03L 7/097; H03L 7/18; H03L 7/181; H03L 7/183; H03L 7/193; H03L 7/195; H03L 7/197
See application file for complete search history.

(56) References Cited

U.S. PATENT DOCUMENTS

| | | | | |
|---|---|---|---|---|
| 5,818,797 A | * | 10/1998 | Watanabe | ............... G04F 10/00 |
| | | | | 368/113 |
| 8,390,347 B1 | * | 3/2013 | Sinha | ...................... H03L 7/089 |
| | | | | 327/156 |
| 9,362,924 B1 | * | 6/2016 | Xu | .......................... H03L 7/085 |

(Continued)

OTHER PUBLICATIONS

Noble et al., A 15b, Sub-10ps Resolution, Low Dead Time, Wide Range Two-Stage TDC, Department of Electrical and Computer Engineering, Texas A&M University, College Station, TX, USA 77843, 978-1-4799-4132-2/14, IEEE, 2014, pp. 13-16.

(Continued)

*Primary Examiner* — Levi Gannon
(74) *Attorney, Agent, or Firm* — Chui-kiu Teresa Wong

(57) ABSTRACT

A digital phase-frequency detector characterizes a delay between two input clock signals using a ring oscillator. A cycle count of a ring oscillator signal circulating through a loop in the ring oscillator during the delay provides a coarse measurement of the delay. A phase of the ring oscillator signal in the loop at the end of the delay provides a fine measurement of the delay. A digital phase-locked loop may control an oscillation frequency of a digitally-controlled oscillator responsive to the fine measurement of the delay and control a division within a clock divider responsive to the coarse measurement of the delay.

20 Claims, 6 Drawing Sheets

(51) Int. Cl.
  *H03L 7/093* (2006.01)
  *H04M 1/725* (2021.01)

(56) References Cited

U.S. PATENT DOCUMENTS

| | | | |
|---|---|---|---|
| 10,819,355 B1* | 10/2020 | Abughazaleh | G04F 10/005 |
| 2007/0096836 A1* | 5/2007 | Lee | G04F 10/005 |
| | | | 331/57 |
| 2009/0096538 A1* | 4/2009 | Chang | H03L 7/0991 |
| | | | 331/1 A |
| 2009/0195277 A1 | 8/2009 | Yamakido et al. | |
| 2009/0256601 A1 | 10/2009 | Zhang et al. | |
| 2010/0260242 A1* | 10/2010 | Abe | H03L 7/0812 |
| | | | 375/219 |
| 2010/0264993 A1* | 10/2010 | Wang | H03L 7/1976 |
| | | | 331/1 A |
| 2012/0200328 A1 | 8/2012 | Yao | |
| 2013/0234800 A1 | 9/2013 | Lee et al. | |
| 2016/0056827 A1* | 2/2016 | Vlachogiannakis | |
| | | | H03B 5/1296 |
| | | | 327/158 |
| 2017/0244544 A1 | 8/2017 | Galton et al. | |
| 2019/0028108 A1* | 1/2019 | Gao | H03L 7/0891 |

OTHER PUBLICATIONS

International Search Report and Written Opinion—PCT/US2021/060594—ISA/EPO—dated May 3, 2022.
Partial International Search Report—PCT/US2021/060594—ISA/EPO—dated Feb. 23, 2022.

* cited by examiner generating a sign signal responsive to whether a first signal is leading or lagging a second signal, wherein one of the first signal and the second signal is a leading signal and one is a lagging signal — 500 responsive to a beginning of a delay between the leading signal and the lagging signal, triggering a ring oscillator signal to begin circulating within a ring oscillator having a plurality of delay cells — 505 detecting a phase of the ring oscillator signal at an end of the delay responsive to a binary value of an output signal from each of the delay cells. — 510

FIG. 5

DIGITAL PHASE-FREQUENCY DETECTOR WITH SPLIT CONTROL LOOPS FOR LOW JITTER AND FAST LOCKING

TECHNICAL FIELD

This application relates to digital phase-frequency detectors, and more particularly, to a digital phase-frequency detector with both a fast control loop and a reduced-speed control loop for low jitter and fast locking.

BACKGROUND

Digital phase-locked loops (DPLLs) typically require a time-to-digital converter (TDC) to digitize the delay between a reference clock signal and a feedback clock signal. The TDC is thus acting as a phase detector within the DPLL. The TDC generally requires a relatively large dynamic range as the delay ranges from an initially large value prior to lock of the DPLL to a substantially zero value at lock. This dynamic range is commonly realized using a delay chain having a relatively large number of delay cells. As the supply voltage changes, the delay for each delay cell will change as well, which leads to jitter in the DPLL. Conventional TDCs are thus relatively bulky due to the large number of delay elements and require additional power regulation to provide a constant supply voltage to the delay chain.

To avoid the complexity and power consumption of a relatively large delay chain, it is known to implement the phase detector using a bang-bang phase detector. As implied by the designation "bang-bang," a bang-bang phase detector converts the delay between the reference clock signal and the divided clock signal into a one-bit output signal that is either logically true or false depending upon whether the feedback clock signal is leading or lagging the reference clock signal. A bang-bang phase detector thus functions as a one-bit TDC and offers low jitter. But since a bang-bang phase detector can only provide a one-bit output signal to the DPLL's loop filter, the settling time to achieve lock is relatively long. Retaining the advantageous jitter properties from the use of a bang-bang phase detector yet achieving faster lock times leads to DPLLs with complicated circuits and control algorithms.

SUMMARY

A detector is provided that includes: a bang-bang phase-frequency detector configured to provide a sign output responsive to whether a first signal is leading or lagging a second signal; a time-to-digital converter including: a ring oscillator having a plurality of delay cells arranged in a loop for a ring oscillator signal; a counter configured to count a number of cycles through the loop of the ring oscillator signal during a delay between the first signal and the second signal to provide a count; and a plurality of memory elements corresponding to the plurality of delay cells, each memory element being configured to store a binary state of an output signal from the corresponding delay cell at an end of the delay.

In addition, a method is provided that includes: generating a sign signal responsive to whether a first signal is leading or lagging a second signal, wherein one of the first signal and the second signal is a leading signal and one is a lagging signal; responsive to a beginning of a delay between the leading signal and the lagging signal, triggering a ring oscillator signal to begin circulating within a ring oscillator having a plurality of delay cells; and detecting a phase of the ring oscillator signal at an end of the delay responsive to a binary value of an output signal from each of the delay cells.

Finally, a phase-locked loop is provided that includes; a digital loop filter; a digitally-controlled oscillator; a clock divider configured to divide an output clock signal from the digitally-controlled oscillator to form a divided clock signal; and a digital phase-frequency detector configured to drive the digital loop filter with a phase of a ring oscillator signal in a loop of a ring oscillator and configured to adjust a divisor used by the clock divider to divide the output clock signal responsive to a count of cycles of the ring oscillator signal through the loop of the ring oscillator.

These and other advantageous features may be better appreciated through the following detailed description.

BRIEF DESCRIPTION OF THE DRAWINGS

FIG. 5 is a flowchart for an example method of operation for a digital phase-frequency detector in accordance with an aspect of the disclosure.

Implementations of the present disclosure and their advantages are best understood by referring to the detailed description that follows. It should be appreciated that like reference numerals are used to identify like elements illustrated in one or more of the figure.

DETAILED DESCRIPTION

Figure 1:
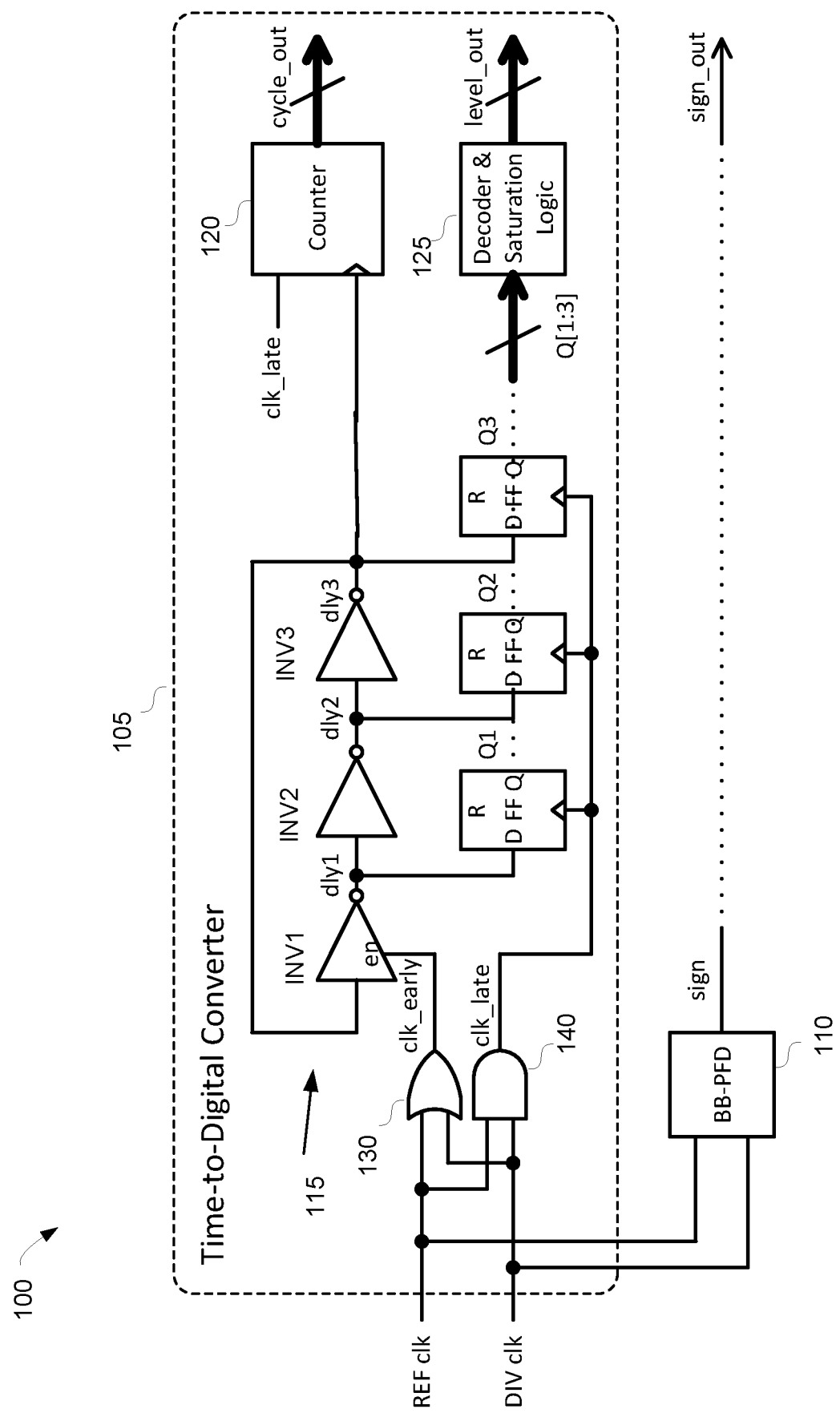
FIG. 1 is a diagram of an example digital phase-frequency detector in accordance with an aspect of the disclosure.

A digital phase-frequency detector is disclosed that offers to a DPLL the low jitter of a bang-bang phase detector in a single control loop architecture yet provides fast settling time. To provide these advantages, the digital phase-frequency detector includes a time-to-digital converter (TDC) including a ring oscillator formed by a loop of delay cells. The TDC triggers an initial one of delay cells to begin the circulating of a ring oscillator signal through the loop of the delay cells responsive to whichever of a reference clock signal and a feedback clock signal has a first-arriving clock edge. The following discussion will assume that signal edges discussed herein are rising edges, but it will be appreciated that a delay may instead be measured between falling edges. The TDC also includes a counter for counting a number of cycles of the ring oscillator signal through the loop during the delay to provide a cycle count.

The TDC also includes a memory element for each delay cell. For example, if the loop includes N delay cells, there may be N corresponding memory elements, N being a positive integer. Each memory element stores either a logical one or zero depending upon a binary value of an output signal from the corresponding delay cell. The contents of the memory elements are retrieved at the end of the delay to form a digital word. The digital word represents the phase (how far it has propagated) of the ring oscillator signal through the loop of the delay cells. The ring oscillator signal is a pulse with both a rising edge and a falling edge. The rising edge occurs as an inverter drives the ring oscillator signal from ground to a power supply voltage. Conversely, a falling edge occurs as an inverter discharges the ring oscillator signal from the power supply voltage to ground.

Since a complete cycle of the ring oscillator signal through the N inverters in the loop is only completed after both the rising edge and the falling edge pass through all N inverters, there are 2*N possible phases as the ring oscillator signal completes its cycle. The N-bit-wide digital word from the N memory elements thus has 2*N values representing the 2*N possible phases. The TDC includes a decoder to decode the digital word into the corresponding phase, starting from a minimum phase to a maximum phase. If the ring oscillator signal has made a complete cycle through the loop, the decoder also functions to saturate the phase at the maximum phase.

Consider the advantages of the resulting digital phase-frequency detector when used, for example, in a DPLL. Prior to lock, the reference clock signal and the feedback clock signal may be relatively out of phase with each other. To measure such a large phase detection range and adjust the DPLL output clock signal frequency so that the feedback clock signal and the reference clock signal are synchronized generally required a relatively large delay chain that consumes power and semiconductor die space and increases jitter. A bang-bang phase-frequency detector traditionally provided low jitter but took too long for the DPLL to achieve lock. But the digital phase-frequency detector disclosed herein achieves the large phase detection range of delay chain (delay line) approaches using a compact ring oscillator while still maintaining the low jitter of bang-bang architectures.

The digital phase-frequency detector allows the DPLL to have a coarse acquisition feedback loop and a fine acquisition feedback loop. The coarse acquisition feedback loop is controlled by the cycle count from the counter whereas the fine acquisition feedback loop is controlled by the ring oscillator phase as decoded from the digital word. Note that neither the cycle count nor the ring oscillator phase is signed in that both signals are measures of the delay between the reference clock signal and the feedback clock signal but do not identify which signal is leading and which signal is lagging. The leading/lagging identification instead comes from a sign signal produced by the bang-bang phase-frequency detector. The result is a DPLL with low-jitter, low-power consumption, fast acquisition, low complexity, and high density (a reduced footprint on the semiconductor die).

An example digital phase-frequency detector (DPFD) 100 is shown in FIG. 1. A TDC 105 and a bang-bang phase-frequency detector 110 function to measure the delay between a first signal and a second signal. In the following discussion, it will be assumed that the first signal is a reference clock signal (REF clk) whereas the second clock signal is a divided feedback clock signal (DIV clk) but it will be appreciated that DPFD 100 may be used to measure the delay between any suitable clock signals. The reference clock signal and the feedback clock signal may also be referred to herein as the input clock signals.

As known in the bang-bang phase-frequency detector arts, bang-bang phase-frequency detector 110 functions to provide a sign output signal (sign_out) that represents the sign (positive or negative) of the phase difference between its input clock signals. Note that due to frequency differences, it could be that the slower of the input clock signals could lag more than a full cycle such that it suddenly leads until the faster one of the input clock signals again leads. The sign output from a bang-bang phase detector may thus switch polarity every 2π increment in phase error between the two input clock signals. But bang-bang phase-frequency detector 110 accounts for the frequency difference to avoid these discontinuities as known in the bang-bang phase-frequency detector arts. The polarity of the sign output signal depends upon the implementation. In the following discussion, it will be assumed that the sign output signal is positive if the reference clock signal is leading the divided feedback clock signal. The sign output signal would thus be negative if the reference clock signal is lagging the divided feedback clock signal. However, this convention may be reversed in alternative implementations.

TDC 105 includes a ring oscillator 115 that includes a plurality of N inverters arranged in a ring or loop. In a single-ended implementation, N is an odd number, but it may be even in differential implementations. In TDC 105, ring oscillator 115 includes three inverters. However it will be appreciated that five inverters, or seven, and so on may be used in alternative implementations. A first inverter (INV1) is triggered by an enable signal that may also be denoted as clk_early. A logic gate such as an OR gate 130 processes the reference clock signal and the divided feedback clock signal such that whichever clock signal is leading will trigger OR gate 130 to assert the enable signal so that the ring oscillator signal will begin oscillating through the loop formed by ring oscillator 115. As the ring oscillator signal propagates through ring oscillator 115, the propagation may be characterized according to the output of the corresponding inverter. For example, the ring oscillator signal may be designated as dly1 (the first delay) at the output of the first inverter, dly2 (the second delay) at the output of a second inverter (INV2), and dly3 (the third delay) at the output of a third inverter (INV3).

Prior to the assertion of the enable signal, the dly signals may be set into a known binary state. For example, if the dly1 signal is asserted high to the power supply voltage in a default state prior to the assertion of the enable signal, the second inverter inverts this binary high state to discharge the dly2 signal to ground. In turn, the third inverter inverts the ground state of the dly2 signal to assert the dly3 signal to the power supply voltage. In such an implementation, the default state of the ring oscillator signal may be represented by a 3-bit digital word (Q[1:3]) that equals 101, where a binary 1 represents the state of the dly1 and dly3 signals and a binary 0 represents the state of the dly2 signal. At the assertion of the enable signal, the first inverter will invert the binary high state of the dly3 signal to discharge the dly1 signal to ground. The first phase of the ring oscillator signal may thus be deemed to be a binary transition that has propagated through the first inverter but not yet affected the remainder of the inverters. The binary state of the dly signals at this first phase may thus be represented by the digital word 001. In the next phase increment of the ring oscillator signal, the second inverter inverts the discharged dly1 signal to assert the dly2 signal to the power supply voltage. The second phase of the ring oscillator signal may thus be represented by the digital word 011. It may thus be shown the remaining phases of the ring oscillator signal may be represented in order by the following digital words: 010, 110, and 100 before the oscillation again starts from the default state of 101.

To detect the ring oscillator signal phase, TDC 105 includes a memory element such as a flip-flop for each inverter output to record the binary state of the dly signals responsive to a rising edge of the lagging one of the reference clock signal and the divided clock signal. Since there are three inverters in ring oscillator 115, TDC 105 includes three flip-flops designated as Q1 through Q3. In alternative implementations with a greater number of inverters, TDC 105 would thus have a greater number of memory elements. To detect the arrival of the lagging clock signal, TDC 105 includes a logic gate such as an AND gate 140 that ANDs the reference clock signal and the divided feedback clock signal to form a clock late (clk_late) signal that clocks the flip-flops. In particular, there is a first flip-flop Q1 that stores the binary state of the dly1 signal, a second flip-flop Q2 that stores the binary state of the dly2 signal, and a third flip-flop Q3 that stores the binary state of the dly3 signal.

At the clocking of the flip-flops, the 3-bit digital word Q[1:3] is formed to represent the phase of the ring oscillator signal. A decoder 125 decodes the digital word Q[1:3] to measure the phase of the ring oscillator signal. For example, decoder 125 may decode the starting default phase of 101 as 0, the first phase of 001 as 1, and so on. In this fashion, the digital word Q[1:3] may be decoded into an integer-incremented phase of the ring oscillator phase. The phase may be represented as a level_out signal that increments from 0 to 5 depending upon the propagation of the ring oscillator signal through the loop of inverters.

Since the ring oscillator phase does not identify how many cycles the ring oscillator signal may have propagated through the loop formed by the inverters, TDC 105 includes a counter 120 that may count every complete cycle through the loop such as by being clocked by the dly3 signal. Counter 120 stops counting at the assertion of the clk_late signal. The count (cycle_out) from counter 120 may be used in the coarse feedback loop in a DPLL as discussed further herein. Decoder 125 also includes saturation logic to saturate the level_out signal at the maximum phase value (in this example, 5) if the count is 1 or higher.

Figure 2:
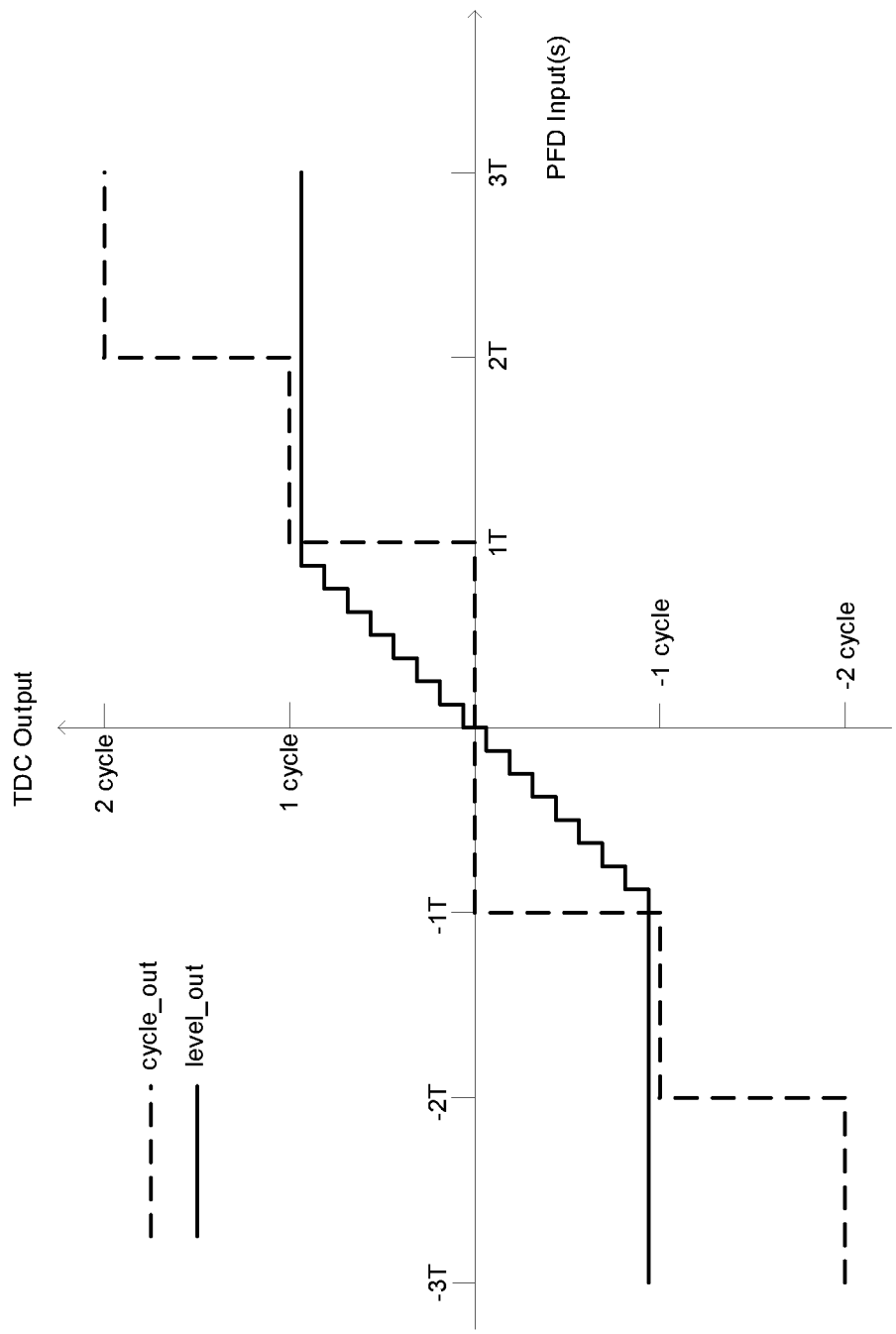
FIG. 2 illustrates some example waveforms for a cycle count and a ring oscillator phase of the digital phase-frequency detector of FIG. 1 with their polarity set by the sign signal in accordance with an aspect of the disclosure.

The cycle count is thus a coarse measurement of the delay between the two input clock signals whereas the phase is a fine measurement (more accurate than the coarse measurement) of the delay. Both measurements are insensitive to which input clock signal is leading or lagging but that information is captured by the sign output signal from the bang-band phase-frequency detector 110. Some example waveforms for the cycle count (designated as cycle_out), the ring oscillator signal phase (designated as level_out) and the sign output signal from DPFD 100 are shown in FIG. 2. The delay through a complete cycle of the loop in ring oscillator 115 is represented by a variable T. If the delay between the two input clock signals is less than T for either a leading or lagging situation, the cycle count is zero. With the cycle count being zero, the phase may increase in linear increments from a negative saturated value to a positive saturated value. As the delay increases over a cycle, the cycle count either increments negatively or positively depending upon which input clock signal is leading or lagging.

Figure 3:
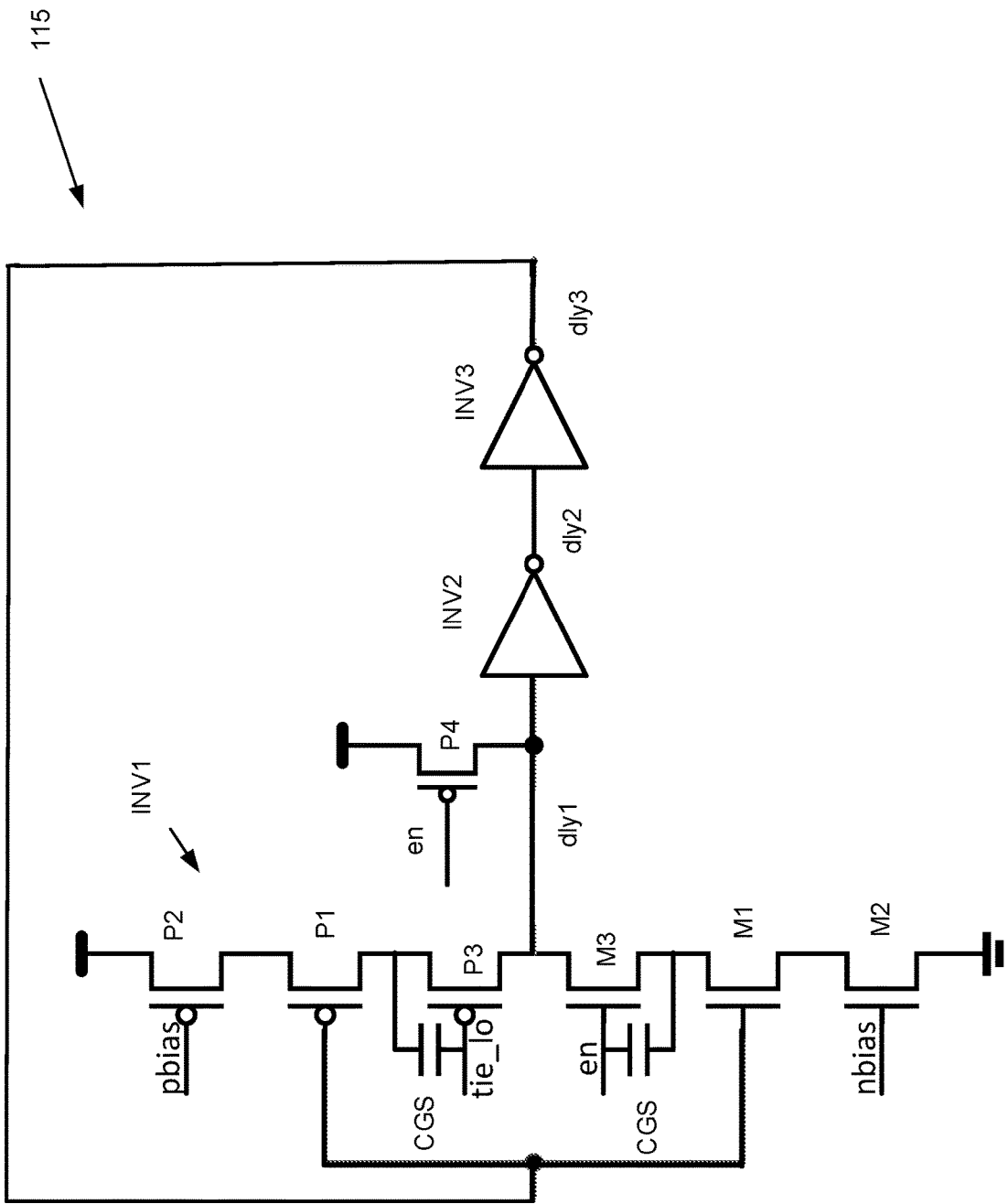
FIG. 3 is a circuit diagram of an example ring oscillator in accordance with an aspect of the disclosure.

A self-compensation of the inverters will now be discussed that makes the inverters substantially insensitive to variations in the power supply voltage across an expected operating range. The gate delay through an inverter in ring oscillator 115 may rise and fall undesirably with corresponding increases and decrease in the power supply voltage. The self-compensation substantially prevents such a delay variation. To better illustrate this self-compensation, ring oscillator 115 is shown in more detail in FIG. 3. The first inverter (INV1) is formed by a p-type metal-oxide semiconductor (PMOS) transistor P1 and an n-type metal-oxide semiconductor (NMOS) transistor M1 that have their gates connected to an output of the third inverter (INV1) to complete the loop. To self-compensate the first inverter, a source of transistor P1 couples to a power supply node through a current source PMOS transistor P2 that has its gate biased by a bias voltage (pbias) such that transistor P2 conducts a bias current (Ib) during a binary transition for the first inverter. Similarly, a source of transistor M1 couples to ground through a current source NMOS transistor M2 that has its gate biased by a bias voltage (nbias) so that transistor M2 also conducts the bias current during a binary transition for the first inverter. The enable signal drives a gate of an NMOS transistor M3 having a drain forming an output node for the first inverter and having a source connected to a drain of transistor M1. Prior to the start of the delay period being measured between the two input clock signals, the enable signal is grounded such that transistor M3 is off. A PMOS transistor P4 has its source connected to the power supply node and a drain connected to the output of the first inverter. The output of the first inverter (dly1) is thus charged to the power supply voltage so that ring oscillator has a known default state prior to the delay measurement as discussed earlier. But when the enable signal is asserted, the first inverter will invert the binary high output from the third inverter (INV3) so as to begin discharging the dly1 signal. Transistor M3 has a parasitic gate-to-source capacitance (CGS) that is charged to a trip voltage for the first inverter when the first inverter begins a binary transition (changing the binary state of the dly1 signal). It can be shown that the delay from the charging of the CGS capacitance to a trip voltage for transistor M3 is proportional to the power supply voltage since the trip voltage is approximately one-half the power supply voltage. This is quite advantageous because the delay from the charging of the CGS capacitance to the trip voltage is at odds with the inverter delay through the subsequent inverters INV2 and INV3, which decreases with the power supply voltage. The total delay through the loop of the ring oscillator 115 is thus substantially self-compensated to variations in the power supply voltage. A parasitic CGS capacitance for the P3 transistor functions analogously when the first inverter functions to charge the dly1 signal from ground to the power supply voltage. The use of the parasitic capacitance of transistors P3 and M3 advantageously saves semiconductor die space as compared to implementing the desired capacitance using external capacitors.

The gate of transistor P3 is tied low (tie_lo) to ground so that transistor P3 is always on as the enable function is performed by transistor M3. The remaining inverters INV2 and INV3 are constructed with their own versions of transistors P1, P2, P3, M1, M2, and M3 so that these remaining inverters are balanced with the first inverter and are also self-compensated. Since these remaining inverters do not need to respond to the enable signal, the equivalent of transistor M3 in the remaining inverters has its gate connected to the power supply voltage node. In addition, the remaining inverters do not need an equivalent of transistor P4 since the binary state of the remaining inverters in the default state is set by transistor P4.

Figure 4:
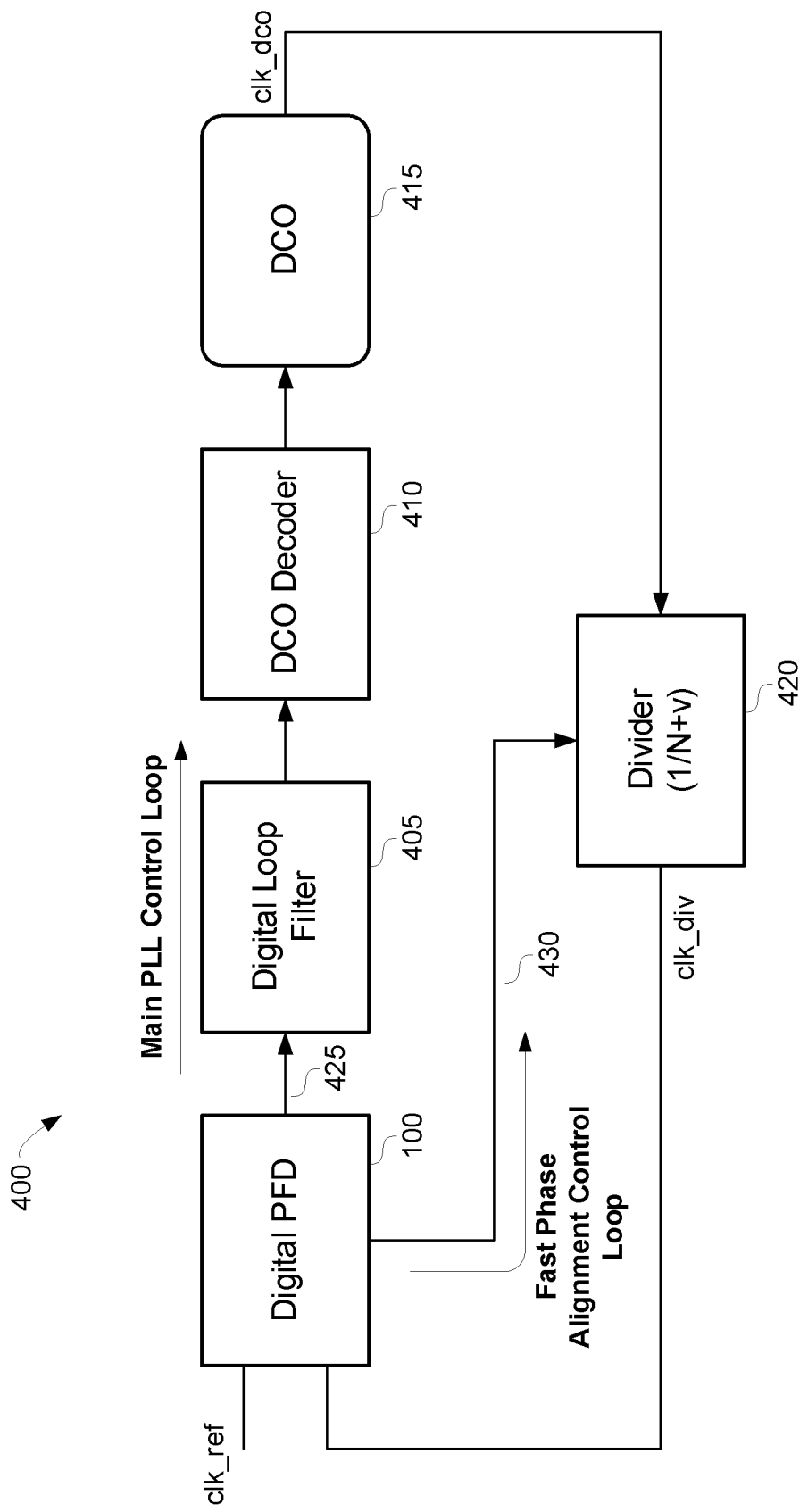
FIG. 4 illustrates an example digital phase-locked loop including a digital phase-frequency detector in accordance with an aspect of the disclosure.

A DPLL 400 including DPFD 100 is shown in FIG. 4. From DPFD 100, the phase signal with a polarity set by the sign signal functions as an input to a digital loop filter 405. For example, the sign signal and the phase signal may be multiplied to drive digital loop filter with a signed phase signal. Digital loop filter 405 filters the signed phase signal to drive a decoder 410 for a digitally-controlled oscillator (DCO) 415. Decoder 410 decodes the filtered signed phase signal to tune an oscillation frequency of DCO 415 and thus control the frequency of an output clock signal (clk_dco). A clock divider 420 divides the output clock signal to form the divided feedback clock signal. DPLL 400 is an integer DPLL such that the divided clock signal is feedback directly to the DPFD 100. It will be appreciated, however, that the divided feedback clock signal may instead be dithered or processed as known in the fractional-N PLL arts in a fractional-N DPLL implementation. The divider modulus by which clock divider 420 divides the output clock signal to form the divided clock signal (clk_div) is controlled by the sign signal and the cycle count. DPLL 400 thus has a main PLL feedback or control loop that is responsive to the signed phase signal. In addition, DPLL 400 has a fast phase alignment control loop that is responsive to the signed cycle count (e.g., a product of the sign output signal and the cycle count).

Prior to a lock of DPLL 400, the delay between the divided feedback clock signal and the reference clock signal (clk_ref) may be relatively large such that the phase signal is saturated and the cycle count is greater than zero. For example, referring again to FIG. 2, the delay may be relatively large such as to produce a −2 or −1 count (the divided clock signal lagging) or a +1 or a +2 count (the divided clock signal leading). With the divided clock signal lagging by one or more cycles, DPFD 100 reduces the divider modulus accordingly to increase a frequency of the divided clock signal. This phase alignment from advancing the divided clock signal occurs relatively quickly since it just involves changing the divider modulus. Similarly, with the divided clock signal leading by one or more cycles, DPFD 100 increases the divider modulus accordingly to delay the divided clock signal. The phase signal would be saturated during these adjustments. But given the rapid response through the divider modulus change, the cycle count will be quickly reduced to zero so that the ring oscillator phase is no longer saturated. The feedback through the main PLL control loop then functions to reduce the ring oscillator phase until lock is achieved. During lock, the main PLL control loop may respond just to the sign output signal (bang-bang feedback control) in some implementations.

A method of operation for an example digital phase-frequency detector will now be discussed regarding the flowchart of FIG. 5. The method includes an act 500 of generating a sign signal responsive to whether a first signal is leading or lagging a second signal, wherein one of the first signal and the second signal is a leading signal and one is a lagging signal. The generation of the sign signal by bang-band phase-frequency detector 110 is an example of act 500. In addition, the method includes an act 505 that is responsive to a beginning of a delay between the leading signal and the lagging signal and includes triggering a ring oscillator signal to begin circulating within a ring oscillator having a plurality of delay cells. The assertion of the enable signal to begin the ring oscillator signal oscillation in ring oscillator 115 is an example of act 505. Finally, the method includes an act 510 of detecting a phase of the ring oscillator signal at an end of the delay responsive to a binary value of an output signal from each of the delay cells. The clocking of the flip-flops and the decoding of the resulting digital word from the flip-flops to form the ring oscillator phase is an example of act 510.

Figure 6:
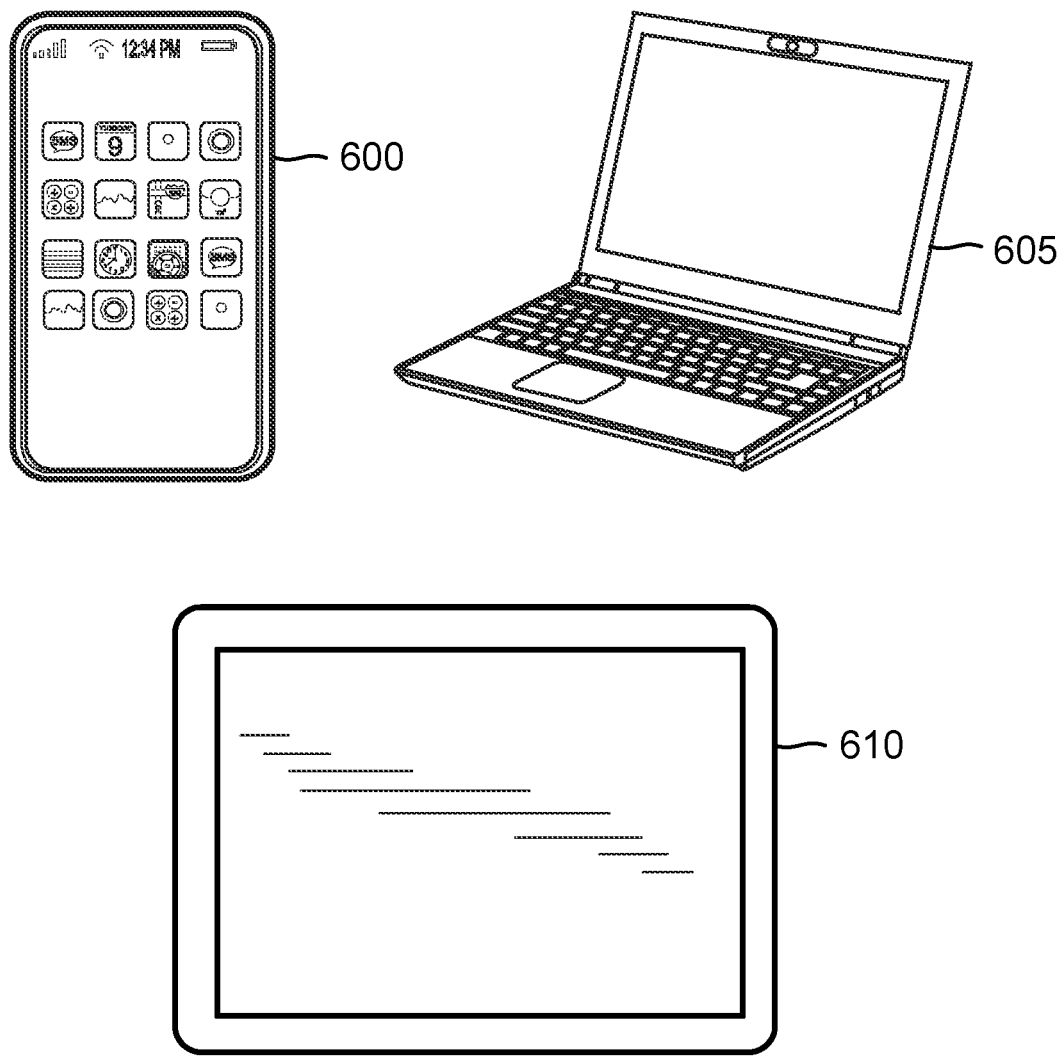
FIG. 6 illustrates some example electronic devices including a digital phase-frequency detector in a phase-locked loop in accordance with an aspect of the disclosure.

A digital phase-frequency detector as disclosed herein may be incorporated in any suitable mobile device or electronic system. For example, as shown in FIG. 6, a cellular telephone 600, a laptop computer 605, and a tablet PC 610 may all include a digital phase-frequency detector within a phase-locked loop in accordance with the disclosure. Other exemplary electronic systems such as a music player, a video player, a communication device, and a personal computer may also be configured with a digital phase-frequency detector constructed in accordance with the disclosure.

The disclosure will now be summarized in the following series of clauses:

Clause 1. A detector, comprising:
a bang-bang phase-frequency detector configured to provide a sign output responsive to whether a first signal is leading or lagging a second signal, wherein one of the first signal and the second signal is a leading signal and one is a lagging signal;
a time-to-digital converter including:
a ring oscillator having a plurality of delay cells arranged in a loop for a ring oscillator signal;
a counter configured to count a number of cycles through the loop of the ring oscillator signal during a delay between the leading signal and the lagging signal to provide a count; and
a plurality of memory elements corresponding to the plurality of delay cells, each memory element being configured to store a binary state of an output signal from the corresponding delay cell at an end of the delay.

Clause 2. The detector of clause 1, wherein each memory element is a flip-flop having a data input coupled to an output of the corresponding delay cell.

Clause 3. The detector of any of clauses 1-2, wherein the time-to-digital converter includes a logic gate configured to clock each flip-flop responsive to an end of the delay.

Clause 4. The detector of clause 3, wherein the logic gate is an AND gate configured to AND the first signal and the second signal.

Clause 5. The detector of any of clauses 1-4, further comprising:
a decoder configured to decode a digital word from the plurality of memory elements to provide a phase for the ring oscillator signal.

Clause 6. The detector of clause 5, wherein the plurality of delay cells comprises a plurality of N delay cells, N being a positive integer, the detector further comprising: a logic circuit configured to saturate the phase from exceeding N.

Clause 7. The detector of any of clauses 1-6, further comprising:
an OR gate configured to OR the first signal with the second signal to produce an enable signal.

Clause 8. The detector of any of clauses 1-7, wherein the plurality of delay cells comprises a plurality of inverters.

Clause 9. The detector of clause 8, wherein a first inverter in the plurality of inverters is configured to respond to the enable signal to generate the ring oscillator signal to start the delay.

Clause 10. The detector of clause 9, wherein the first inverter comprises:
a first p-type metal-oxide semiconductor (PMOS) transistor;
a second PMOS transistor coupled between a drain of the first PMOS transistor and an output node for the first inverter;
a first n-type metal-oxide semiconductor (NMOS) transistor; and
a second NMOS transistor having a drain connected to the output node, a source connected to a drain of the first NMOS transistor, and a gate connected to a node for the enable signal, wherein an input node for the first inverter is coupled to a gate of the first PMOS transistor and to a gate of the first NMOS transistor.

Clause 11. The detector of clause 10, wherein a gate of the second PMOS transistor is coupled to ground, the first inverter further comprising:

a bias current PMOS transistor having a source coupled to a power supply node and drain connected to a source of the first PMOS transistor; and a bias current NMOS transistor having a source connected to ground and a drain connected to a source of the first NMOS transistor.

Clause 12. A method, comprising:

generating a sign signal responsive to whether a first signal is leading or lagging a second signal, wherein one of the first signal and the second signal is a leading signal and one is a lagging signal;

responsive to a beginning of a delay between the leading signal and the lagging signal, triggering a ring oscillator signal to begin circulating within a ring oscillator having a plurality of delay cells; and detecting a phase of the ring oscillator signal at an end of the delay responsive to a binary value of an output signal from each delay cell in the plurality of delay cells.

Clause 13. The method of clause 12, further comprising:

counting a number of cycles of the ring oscillator signal through the ring oscillator during the delay to provide a cycle count.

Clause 14. The method of any of clauses 12-13, further comprising:

clocking a plurality of memory elements at the end of the delay to store the binary value of the output signal from each delay cell in the plurality of delay cells to form a digital word; and decoding the digital word to detect the phase of the ring oscillator signal.

Clause 15. The method of clause 13, further comprising:

saturating the phase of the ring oscillator signal responsive to the cycle count being greater than zero.

Clause 16. The method of any of clauses 13 and 15, further comprising:

multiplying the phase of the ring oscillator signal with the sign signal to provide a signed phase signal; and driving a digital filter in a phase-locked loop with the signed phase signal.

Clause 17. The method of clause 16, further comprising:

multiplying the cycle count with the sign signal to provide a signed cycle count; and adjusting a division in a clock divider in the phase-locked loop responsive to the signed cycle count.

Clause 18. The method of any of clauses 12-17, wherein generating the sign signal comprises processing the first signal and the second signal in a bang-bang phase-frequency detector.

Clause 19. A phase-locked loop, comprising:

a digital loop filter;

a digitally-controlled oscillator;

a clock divider configured to divide an output clock signal from the digitally-controlled oscillator to form a divided clock signal; and a digital phase-frequency detector configured to drive the digital loop filter responsive to a phase of a ring oscillator signal in a ring oscillator and configured to adjust a divisor used by the clock divider to divide the output clock signal responsive to a count of cycles of the ring oscillator signal through the loop of the ring oscillator.

Clause 20. The phase-locked loop of clause 19, further comprising:

a decoder configured to decode a filtered signal from the digital loop filter to control an oscillation frequency of the digitally-controlled oscillator.

Clause 21. The phase-locked loop of any of clauses 19-20, wherein the digital phase-frequency detector is configured to trigger an oscillation of the ring oscillator signal in the ring oscillator responsive to a leading one of a reference clock signal and a feedback clock signal.

Clause 22. The phase-locked loop of clause 21, wherein the digital phase-frequency detector further includes a bang-bang phase frequency detector configured to generate a sign signal responsive to whether the reference clock signal is leading or lagging the feedback clock signal.

Clause 23. The phase-locked loop of any of clauses 19-22, wherein the ring oscillator comprises an odd number of inverters.

Clause 24. The phase-locked loop of clause 23, wherein the odd number of inverters comprises three inverters.

Clause 25. The phase-locked loop of any of clauses 19-24, wherein the phase-locked loop is integrated within a cellular telephone.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A detector, comprising:
   a bang-bang phase-frequency detector configured to provide a sign output responsive to whether a first signal is leading or lagging a second signal, wherein one of the first signal and the second signal is a leading signal and one is a lagging signal;
   a time-to-digital converter including:
      a ring oscillator having a plurality of inverters arranged in a loop for a ring oscillator signal;
      a counter configured to count a number of cycles through the loop of the ring oscillator signal during a delay between the leading signal and the lagging signal to provide a count; and
      a plurality of memory elements corresponding to the plurality of inverters, each memory element being configured to store a binary state of an output signal from the corresponding inverter at an end of the delay.

2. The detector of claim 1, wherein each memory element is a flip-flop having a data input coupled to an output of the corresponding inverter.

3. The detector of claim 1, wherein the time-to-digital converter includes a logic gate configured to clock each flip-flop responsive to an end of the delay.

4. The detector of claim 3, wherein the logic gate is a AND gate configured to AND the first signal and the second signal.

5. The detector of claim 1, further comprising:
   a decoder configured to decode a digital word from the plurality of memory elements to provide a phase for the ring oscillator signal.

6. The detector of claim 5, wherein the plurality of inverters comprises a plurality of N inverters, N being a positive integer, the detector further comprising:
- a logic circuit configured to saturate the phase from exceeding N.

7. The detector of claim 1, further comprising:
- an OR gate configured to OR the first signal with the second signal to produce an enable signal.

8. The detector of claim 1, wherein a first inverter in the plurality of inverters is configured to respond to the enable signal to generate the ring oscillator signal to start the delay.

9. The detector of claim 8, wherein the first inverter comprises:
- a first p-type metal-oxide semiconductor (PMOS) transistor;
- a second PMOS transistor coupled between a drain of the first PMOS transistor and an output node for the first inverter;
- a first n-type metal-oxide semiconductor (NMOS) transistor; and
- a second NMOS transistor having a drain connected to the output node, a source connected to a drain of the first NMOS transistor, and a gate connected to a node for the enable signal, wherein an input node for the first inverter is coupled to a gate of the first PMOS transistor and to a gate of the first NMOS transistor.

10. The detector of claim 9, wherein a gate of the second PMOS transistor is coupled to ground, the first inverter further comprising:
- a bias current PMOS transistor having a source coupled to a power supply node and drain connected to a source of the first PMOS transistor; and
- a bias current NMOS transistor having a source connected to ground and a drain connected to a source of the first NMOS transistor.

11. A method, comprising:
- generating a sign signal responsive to whether a first signal is leading or lagging a second signal, wherein one of the first signal and the second signal is a leading signal and one is a lagging signal;
- responsive to a beginning of a delay between the leading signal and the lagging signal, triggering a ring oscillator signal to begin circulating within a ring oscillator having a plurality of inverters;
- detecting a phase of the ring oscillator signal at an end of the delay responsive to a binary value of an output signal from each inverter in the plurality of inverters;
- counting a number of cycles of the ring oscillator signal through the ring oscillator during the delay to provide a cycle count; and
- saturating the phase of the ring oscillator signal responsive to the cycle count being greater than zero.

12. The method of claim 11, further comprising:
- clocking a plurality of memory elements at the end of the delay to store the binary value of the output signal from each inverter in the plurality of inverters to form a digital word; and
- decoding the digital word to detect the phase of the ring oscillator signal.

13. The method of claim 11, further comprising:
- multiplying the phase of the ring oscillator signal with the sign signal to provide a signed phase signal; and
- driving a digital filter in a phase-locked loop with the signed phase signal.

14. The method of claim 13, further comprising:
- multiplying the cycle count with the sign signal to provide a signed cycle count; and
- adjusting a division in a clock divider in the phase-locked loop responsive to the signed cycle count.

15. The method of claim 11, wherein generating the sign signal comprises processing the first signal and the second signal in a bang-bang phase-frequency detector.

16. A phase-locked loop, comprising:
- a digital loop filter;
- a digitally-controlled oscillator;
- a clock divider configured to divide an output clock signal from the digitally-controlled oscillator to form a divided clock signal; and
- a digital phase-frequency detector configured to drive the digital loop filter responsive to a phase of a ring oscillator signal in a ring oscillator, to adjust a divisor used by the clock divider to divide the output clock signal responsive to a count of cycles of the ring oscillator signal through the loop of the ring oscillator, and to trigger an oscillation of the ring oscillator signal in the ring oscillator responsive to a leading one of a reference clock signal and a feedback clock signal, wherein the digital phase-frequency detector further includes
  - a bang-bang phase frequency detector configured to generate a sign signal responsive to whether the reference clock signal is leading or lagging the feedback clock signal.

17. The phase-locked loop of claim 16, further comprising:
- a decoder configured to decode a filtered signal from the digital loop filter to control an oscillation frequency of the digitally-controlled oscillator.

18. The phase-locked loop of claim 16, wherein the ring oscillator comprises an odd number of inverters.

19. The phase-locked loop of claim 18, wherein the odd number of inverters comprises three inverters.

20. The phase-locked loop of claim 16, wherein the phase-locked loop is integrated within a cellular telephone.

* * * * *